United States Patent
Fletcher et al.

(10) Patent No.: US 8,361,546 B2
(45) Date of Patent: Jan. 29, 2013

(54) FACILITATING ADHESION BETWEEN SUBSTRATE AND PATTERNED LAYER

(75) Inventors: Edward B. Fletcher, Austin, TX (US); Zhengmao Ye, Austin, TX (US); Dwayne L. LaBrake, Cedar Park, TX (US); Frank Y. Xu, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 275 days.

(21) Appl. No.: 12/606,588

(22) Filed: Oct. 27, 2009

(65) Prior Publication Data

US 2010/0112236 A1    May 6, 2010

Related U.S. Application Data

(60) Provisional application No. 61/109,528, filed on Oct. 30, 2008.

(51) Int. Cl.
*B05D 5/10* (2006.01)

(52) U.S. Cl. .................. 427/207.1; 427/133; 427/208.8; 427/569; 428/408; 428/447; 428/698

(58) Field of Classification Search ............... 427/207.1, 427/208.8, 133, 569; 428/408, 447, 698
See application file for complete search history.

(56) References Cited

U.S. PATENT DOCUMENTS

| | | | |
|---|---|---|---|
| 4,506,003 A | 3/1985 | Ruckert et al. | |
| 5,432,700 A | 7/1995 | Hrovat et al. | |
| 5,458,953 A | 10/1995 | Wang | |
| 5,545,367 A | 8/1996 | Bae et al. | |
| 5,578,683 A | 11/1996 | Koch et al. | |
| 5,750,753 A | 5/1998 | Kimae et al. | |
| 5,942,302 A | 8/1999 | Ha et al. | |
| 6,518,168 B1 | 2/2003 | Clem et al. | |
| 6,610,458 B2 | 8/2003 | Miller et al. | |
| 6,667,082 B2 | 12/2003 | Bamore et al. | |
| 6,719,915 B2 | 4/2004 | Willson et al. | |
| 6,720,076 B2 | 4/2004 | McBain | |
| 6,873,087 B1 | 3/2005 | Choi et al. | |
| 6,932,934 B2 | 8/2005 | Choi et al. | |
| 6,936,194 B2 | 8/2005 | Watts | |
| 6,957,608 B1 | 10/2005 | Hubert et al. | |
| 6,958,531 B2 | 10/2005 | Ucok | |
| 7,011,932 B2 | 3/2006 | Ferm et al. | |
| 7,077,992 B2 | 7/2006 | Sreenivasan et al. | |

(Continued)

FOREIGN PATENT DOCUMENTS

| | | | |
|---|---|---|---|
| EP | 0592139 A1 | 4/1994 | |
| EP | 0592972 | 4/1994 | |

(Continued)

OTHER PUBLICATIONS

Bender et al., Multiple Imprinting in UV-based Nanoimprint Lithography: Related Material Issues, Microelectronic Engineering 61-62 (2002) pp. 407-413.

(Continued)

*Primary Examiner* — Michael Cleveland
*Assistant Examiner* — Xiao Zhao
(74) *Attorney, Agent, or Firm* — Cameron A. King

(57) ABSTRACT

Systems and methods for adhering a substrate to a patterned layer are described. Included are in situ cleaning and conditioning of the substrate, and the application of an adhesion layer between the substrate and the patterned layer, as well as forming an intermediate layer between adhesion materials and the substrate.

5 Claims, 4 Drawing Sheets

U.S. PATENT DOCUMENTS

| | | |
|---|---|---|
| 7,141,188 B2 | 11/2006 | Li et al. |
| 7,157,036 B2 | 1/2007 | Choi et al. |
| 7,179,396 B2 | 2/2007 | Sreenivasan |
| 7,241,823 B2 | 7/2007 | Kashiwagi et al. |
| 7,307,118 B2 | 12/2007 | Xu et al. |
| 7,309,225 B2 | 12/2007 | McMackin et al. |
| 7,338,275 B2 | 3/2008 | Choi et al. |
| 7,365,103 B2 | 4/2008 | Willson et al. |
| 7,393,789 B2 | 7/2008 | Abatchev et al. |
| 7,396,475 B2 | 7/2008 | Sreenivasan |
| 7,759,407 B2 | 7/2010 | Xu |
| 2002/0094496 A1 | 7/2002 | Choi et al. |
| 2002/0123592 A1 | 9/2002 | Zhang |
| 2003/0235787 A1 | 12/2003 | Watts et al. |
| 2004/0037956 A1 | 2/2004 | Yang |
| 2004/0065252 A1 | 4/2004 | Sreenivasan et al. |
| 2004/0065976 A1 | 4/2004 | Sreenivasan et al. |
| 2004/0110096 A1 | 6/2004 | Kishioka et al. |
| 2004/0116548 A1 | 6/2004 | Willson et al. |
| 2004/0127613 A1 | 7/2004 | Kashiwagi et al. |
| 2004/0168613 A1 | 9/2004 | Nguyen et al. |
| 2004/0175631 A1 | 9/2004 | Crocker et al. |
| 2004/0191429 A1 | 9/2004 | Patrick |
| 2004/0259992 A1 | 12/2004 | Gobel |
| 2005/0098534 A1 | 5/2005 | Sreenivasan et al. |
| 2005/0160934 A1 | 7/2005 | Xu et al. |
| 2005/0187339 A1 | 8/2005 | Xu et al. |
| 2005/0224452 A1 | 10/2005 | Spiess et al. |
| 2006/0029811 A1 | 2/2006 | Sugioka et al. |
| 2006/0030071 A1 | 2/2006 | Mizukoshi et al. |
| 2006/0030653 A1 | 2/2006 | Hu et al. |
| 2006/0046069 A1 | 3/2006 | Jung |
| 2006/0062922 A1 | 3/2006 | Xu et al. |
| 2006/0081557 A1 | 4/2006 | Xu et al. |
| 2006/0108710 A1 | 5/2006 | Xu et al. |
| 2006/0110914 A1 | 5/2006 | Gehoski et al. |
| 2006/0145398 A1 | 7/2006 | Bailey et al. |
| 2006/0175736 A1 | 8/2006 | Xu et al. |
| 2006/0279024 A1 | 12/2006 | Choi et al. |
| 2007/0017631 A1 | 1/2007 | Xu |
| 2007/0017899 A1* | 1/2007 | LaBrake .................. 216/72 |
| 2007/0021520 A1 | 1/2007 | Xu |
| 2007/0042173 A1 | 2/2007 | Nagaoka et al. |
| 2007/0051697 A1 | 3/2007 | DiPietro et al. |
| 2007/0059211 A1 | 3/2007 | Edmiston |
| 2007/0212494 A1 | 9/2007 | Xu et al. |
| 2007/0272825 A1 | 11/2007 | Xu et al. |
| 2008/0110557 A1 | 5/2008 | Xu |
| 2008/0131623 A1 | 6/2008 | Zhang et al. |
| 2008/0138460 A1 | 6/2008 | Heidari et al. |
| 2009/0136654 A1 | 5/2009 | Xu et al. |
| 2009/0155583 A1 | 6/2009 | Xu et al. |
| 2009/0197057 A1 | 8/2009 | Xu |
| 2011/0165412 A1 | 7/2011 | Ye et al. |

FOREIGN PATENT DOCUMENTS

| | | |
|---|---|---|
| EP | 1533657 A1 | 5/2005 |
| JP | 61040845 A | 2/1986 |
| JP | 4330650 A | 11/1992 |
| JP | 2002285071 | 10/2002 |
| WO | 0163605 A1 | 8/2001 |
| WO | 2004021083 A1 | 3/2004 |
| WO | WO2004097518 | 11/2004 |
| WO | 2007/050133 A2 | 5/2007 |
| WO | 2008/127835 A1 | 10/2008 |
| WO | 2009/085090 A1 | 7/2009 |
| WO | 2010051024 A1 | 5/2010 |
| WO | WO2011066450 | 6/2011 |

OTHER PUBLICATIONS

Colburn et al., Development and advantages of step-and-flash lithography, Solid State Technology, Jul. 2001, 11 pages.

Peeters et al., "07O-NMR of Sol-Gel Processes of TEOS and TMOS," Journal of Sol-Gel Science and Technology 13 (1998) 71-74.

Taniguchi et al., "Measurement of Adhesive Force Between Mold and Photocurable Resin in Imprint Technology," Japanese Journal of Applied Physics, 41 (2002) 4194-4197.

International Search Report for Publication No. WO2009/085090, dated Jun. 1, 2009, 1 page.

International Search Report for Publication No. WO2008/127835, dated Jun. 25, 2008, 2 pages.

International Search Report for Publication No. WO2007/050133, dated Sep. 13, 2007, 1 page.

Extended European Search Report for Publication EP 08744071, dated Dec. 22, 2010, 6 pages.

PCT/US2010/058089 International Search Report and Written Opinion, PCT, Aug. 29, 2011.

Matinlinna et al., "The effect of a novel silane blend system on resin bond strength to silica-coated Ti substrate," J. of Dent., 2006, 34:436-443.

Schenectady International, Inc Technical Data Sheet for IsoRad™ 501. [online], [retrieved on Oct. 18, 2011]. Retrieved from the internet: URL: www.siigroup.com/product_documents/IsoRad501. PDF; 1 page.

* cited by examiner

FACILITATING ADHESION BETWEEN SUBSTRATE AND PATTERNED LAYER

REFERENCE TO RELATED APPLICATION

This patent application claims the benefit of U.S. Provisional Application Ser. No. 61/109,528, filed Oct. 30, 2008, the disclosure of which is incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a formable layer (polymerizable) and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
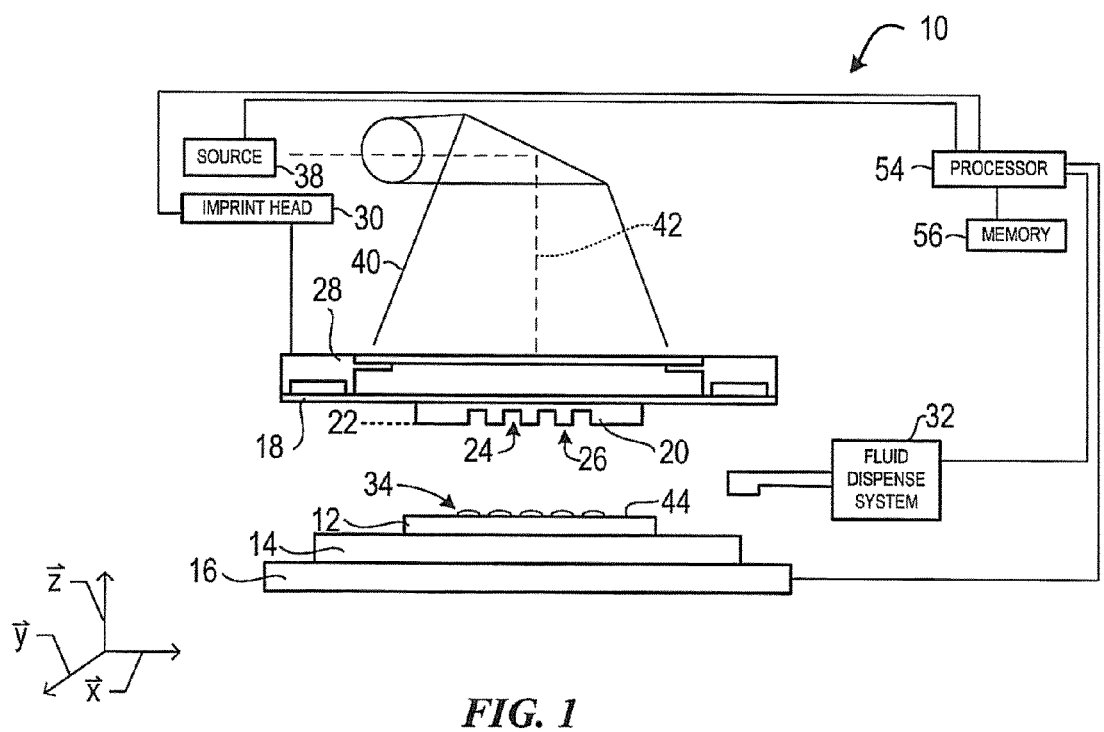
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a polymerizable material as described in U.S. Pat. No. 7,157,036 and U.S. Patent Publication No. 2005/0187339, all of which are hereby incorporated by reference.

Figure 2:
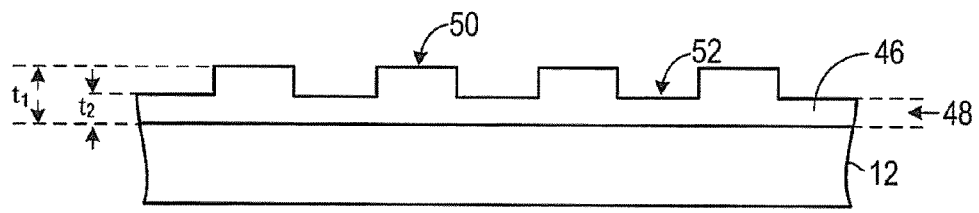
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No 2004/0124566, U.S. Patent Publication No. 2004/0188381, and U.S. Patent Publication No. 2004/0211754, each of which is hereby incorporated by reference.

Surface 44 of substrate 12 may adhere to patterned layer 46 during separation of template 15 and patterned layer 46. However, weak adhesion between surface 44 of substrate 12 and patterned layer 46 may also occur, and may cause substrate 12 to separate from patterned layer 46, which may lead to defects in the patterned layer 46 and yield issues, which is undesirable. As such, an adhesion layer 60 (see FIG. 5) may be positioned between substrate 12 and patterned layer 46 to improve adhesion between substrate 12 and patterned layer 46, described further below.

Adhesion layer 60 may be formed of one or more adhesion materials including, but not limited to: acryloxymethyltrimethoxysilane, Acryloxymethyltriethoxysilane, acryloxypropyltrichlorosilane, and/or acryloxypropyltrimethoxysilane. In some embodiments, the adhesion layer may be further comprised of one or more additional components. An additional component may include 1,2-bis(trimethoxy-silyl)ethane and/or 1,6-bis(trichlorosilyl)hexane. Adhesion materials are further described in U.S. Publication No. 2007/0212494, which is hereby incorporated by reference.

Figure 3:
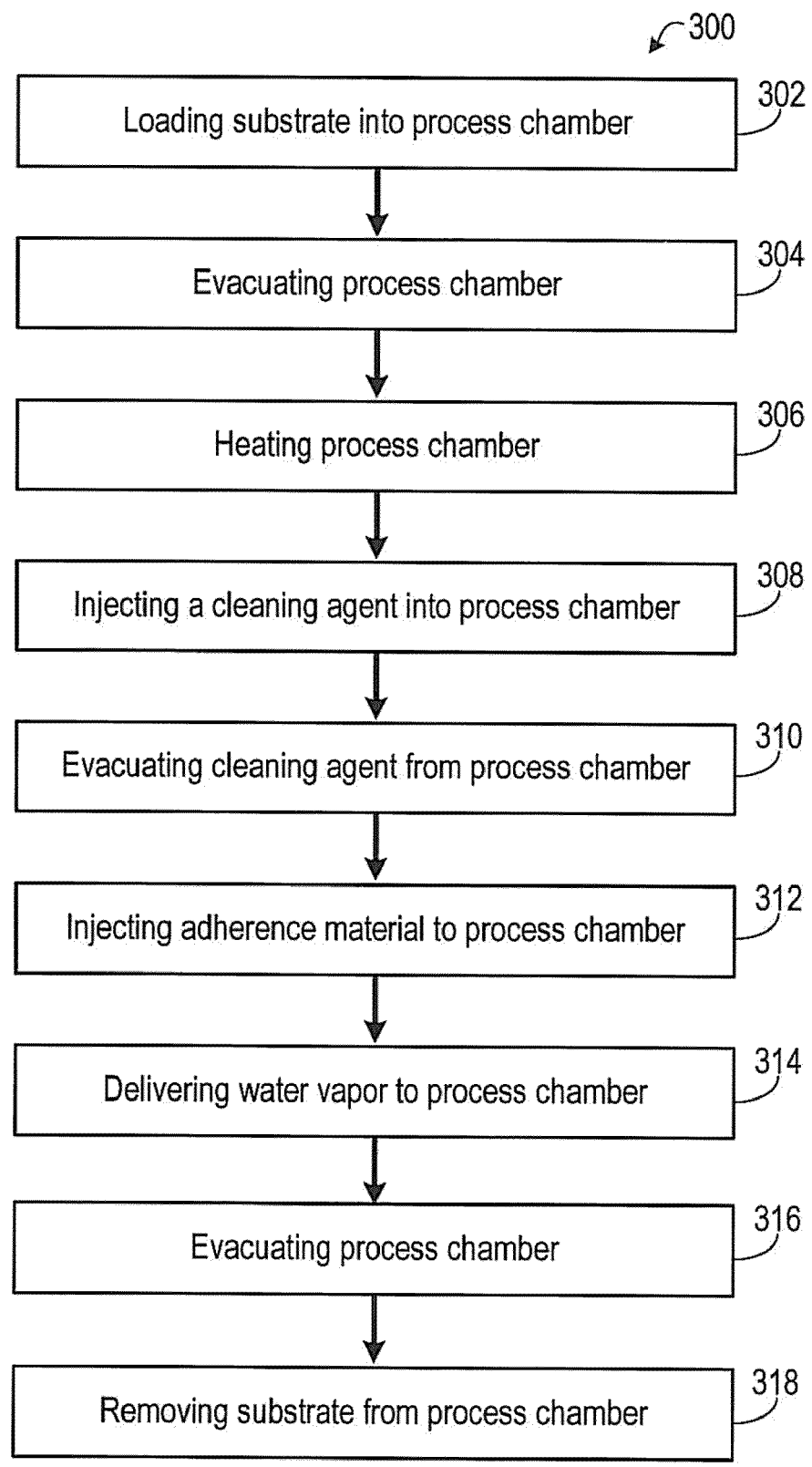
FIG. 3 illustrates a flow chart of a method for in situ ozone processing of a substrate to apply adhesion materials.
Figure 4:
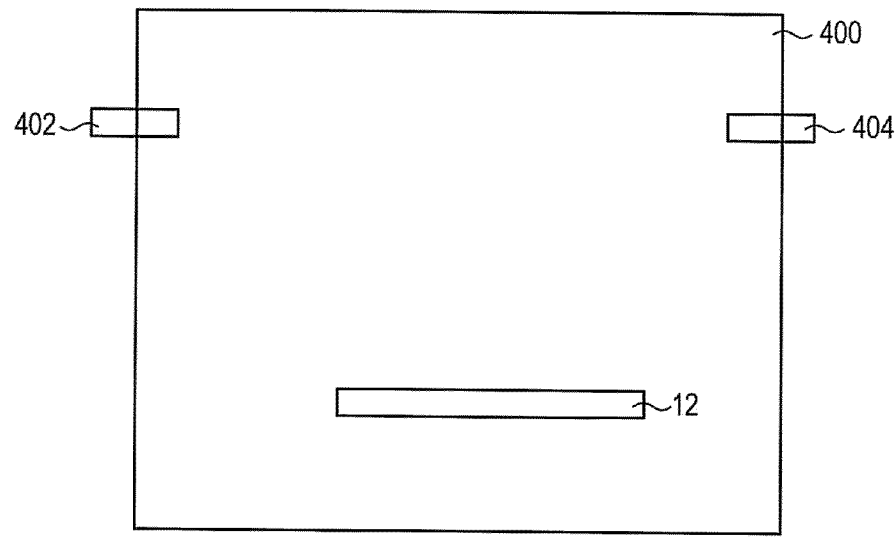
FIG. 4 illustrates a simplified view of a process chamber in accordance with an embodiment of the present invention.

Adhesion Layer Deposition with In Situ Substrate Surface Cleaning and Conditioning FIG. 3 (referring also to FIG. 4) illustrates a flow chart of a method 300 for applying an adhesion layer to a substrate 12 using an in situ process. In one exemplary embodiment, the substrate 12 is an imprint lithography substrate as described above. In step 302, substrate 12 may be placed into a process chamber 400 as shown in FIG. 4. The process chamber 400 shown in FIG. 4 is illustrated for convenience in describing the steps of method 300, and is not limited to the configuration illustrated. Process chamber 400 in FIG. 4 may represent any type of sealable container suitable to one having ordinary skill in the art for accomplishing the steps of method 300, and is not limited otherwise. Further, valves 402 and 404 as shown in FIG. 4 are representative of any suitable sealable access into a process chamber 400, where the valves 402 and 404 are configured for evacuating the process chamber 400 and/or injecting materials into the process chamber 400. In one embodiment, valves 402 and 404 may be comprised of a single valve. In an alternate embodiment, valves 402 and 404 may be comprised of any number of valves. Further, in one embodiment, valves 402 and 404 are interchangeable in use and purpose.

In step 304, the process chamber 400 may be substantially evacuated of gases via valve 402, i.e., nearly all of the air, nitrogen, argon or any other gaseous composition may be evacuated from the process chamber 400 in this step. For example, the process chamber 400 may be evacuated to a base pressure lower than 100 Torr. In an example embodiment, the process chamber 400 may be evacuated to a base pressure lower than 0.2 Torr.

In step 306, the process chamber 400 may be heated to an elevated temperature. For example, the process chamber 400 may be heated to a temperature above that of room temperature, i.e. greater than approximately 25° C. In alternate example embodiments, the process chamber 400 may be heated to a temperature above 25° C., i.e., up to 60° C., up to 90° C., or up to a temperature not to exceed the temperature at which an adherence material may begin to degrade or decompose. Heating the process chamber 400 to the desired temperature may minimize, if not prevent, adherence material vapor from condensing on the process chamber 400 walls. (Adherence material vapor is injected into the process chamber 400 in another step.) Condensation of the adherence material vapor may result in accumulation of the adherence material on the process chamber 400 walls and cause a contamination issue. Hardware attached to the chamber (e.g. doors, valves, tubing, and the like) and/or hardware positioned inside the chamber (e.g. substrate carriers, mandrels, and the like) may also be heated to prevent or minimize the condensation of adherence material to these components.

In step 308, a cleaning agent may be injected into the process chamber 400 via valve 404. The cleaning agent is configured to clean the surface of the substrate 12 of contaminants it may have acquired prior to the evacuation of process chamber 400. For instance, organic contaminants found in the air may adsorb on a surface of a substrate 12. The presence of organic contamination on a surface of a substrate 12 may reduce or prevent an adherence material from bonding to the surface to form an adhesion layer.

Since organic contaminants are not generally washed off with common water cleaning methods, and solvents may remain on the surface of a substrate 12 as well, other methods of cleaning organic material from the substrate 12 are needed. In situ cleaning processes of substrate 12 may be accomplished using several methods, including ozone cleaning, UV/ozone cleaning and plasma cleaning.

Selection of a particular in situ cleaning method depends on the substrate 12 type and any materials layered on the top surface of the substrate 12. For example, many substrates are manufactured with a carbon over coating (CoC) layer 102 on the top surface (See FIGS. 5 and 6). If CoC 102 is on the top surface layer of the substrate 12, oxygen plasma cleaning may cause severe damage to the CoC layer 102. In this case, ozone cleaning may be used to clean the CoC layer 102 and minimize surface degradation. In an embodiment, 250 g/cm$^3$ concentrations of ozone may be introduced to the process chamber 400 for approximately 1 to 30 minutes at 500 Torr to clean the substrate 12 surface.

In step 310, the cleaning agent may be evacuated from the process chamber via valve 402. A number of purge-evacuate cycles may be used to minimize the concentration of residue cleaning agent within the process chamber 400. Residual cleaning agent remaining in the process chamber 400 may cause undesired reactions with the vapor adherence materials (to be injected into the chamber later in the process). In an embodiment, the cleaning agent may be evacuated from the process chamber 400 using two purge-evacuate cycles.

In step 312, metered adherence materials may be injected into the process chamber via valve 404. In one embodiment, the injected adherence materials may be adsorbed onto the surface of the substrate 12, and may initiate a reaction on the surface of the substrate 12. In an exemplary embodiment, the reaction with the adherence materials on the surface of the substrate 12 may form an adhesion layer on the surface of substrate 12. In this manner, an adhesion layer 60 may be positioned onto the substrate 12 (See FIGS. 5 and 6). Depending on the number of disks (substrates 12) in the process chamber 400 and the volume of the process chamber 400, the volume of injected adherence materials may range from less than one microliter to several thousand microliters. For example, the volume of injected adherence materials may range from 0.1 microliters to 10,000 microliters. This reaction between the injected adherence materials and the substrate 12 may continue for 1 to 30 minutes.

In step 314, water vapor may be delivered into the process chamber via valve 404. The surface reaction on the substrate 12 may continue for about the next 1 to 30 minutes.

In step 316, the process chamber 400 may be evacuated of water and any residual adherence materials via valve 402.

In step 318, the substrate 12 may be removed from the process chamber.

Figure 5:
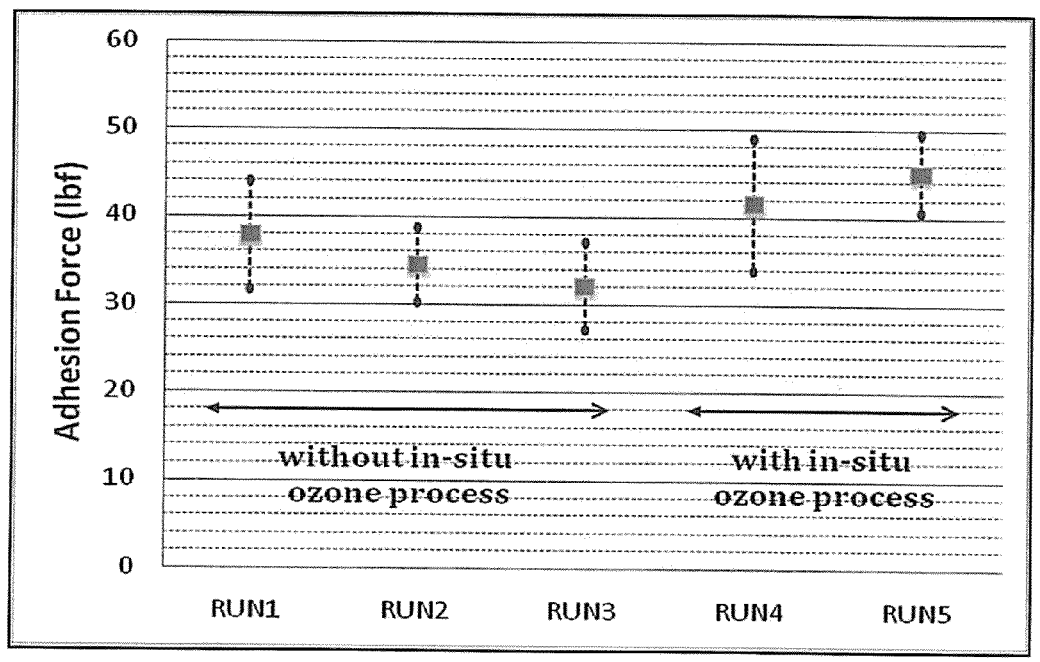
FIG. 5 is a graphical comparison of adhesion with in situ ozone processing and without in situ ozone processing.

FIG. 5 is a graphical comparison of adhesion force in pounds-force (lbf) based on substrate 12 imprint process runs without and with the in situ ozone method 300. Runs 1 to 3 show the resulting adhesion force without an in situ ozone method 300. Runs 4 and 5 show the resulting adhesion force with the in situ ozone method 300. As shown in the illustration, using an in situ ozone method 300 prior to imprinting a substrate 12 may increase the adhesion force between the substrate 12 and a patterned layer 46 imprinted onto the substrate 12. In the examples in the illustration, the mean adhesion force is increased to between 3 and 13 lbf when using an in situ ozone method 300 prior to imprinting a substrate 12.

Intermediate Layer Formation

Figures 6, 7:
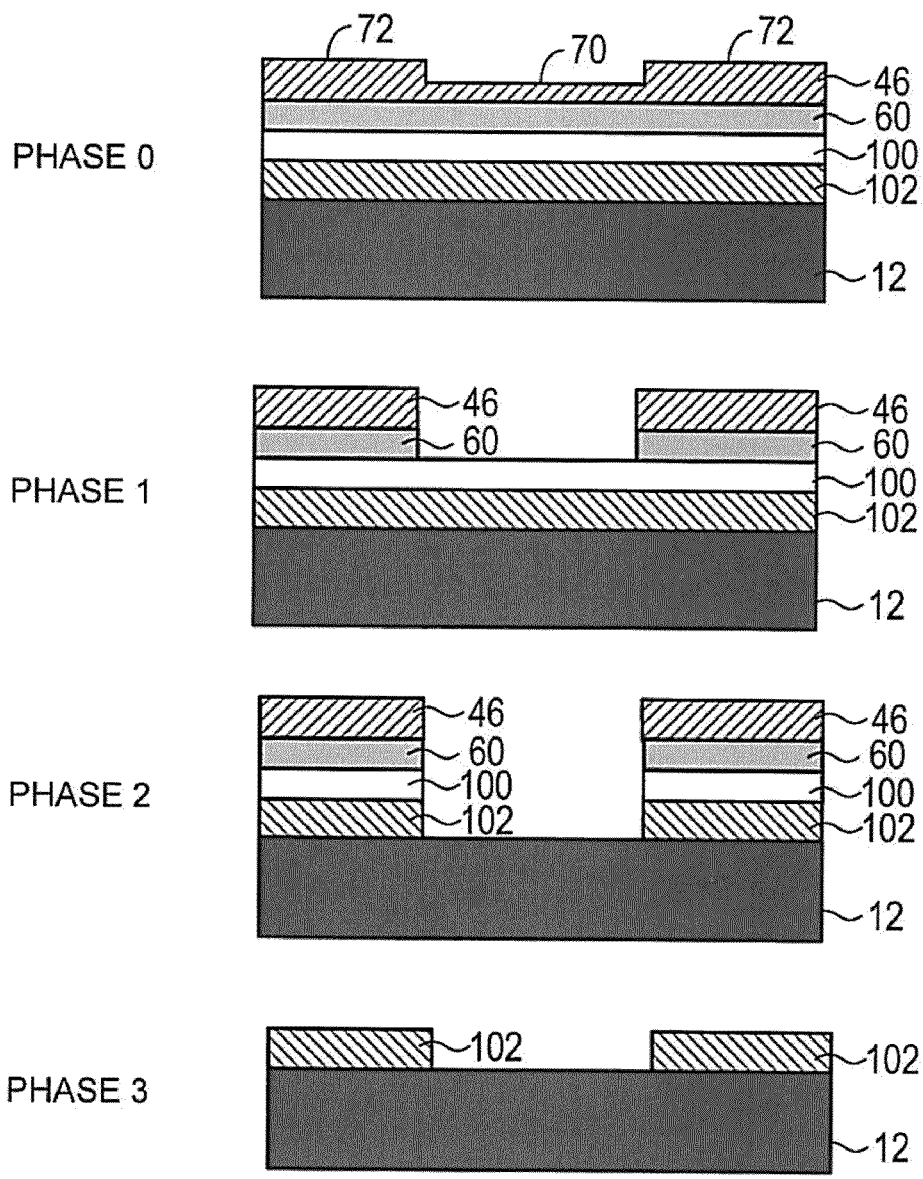
FIG. 6 illustrates a substrate having an adhesive layer thereon.
FIG. 7 illustrates simplified side views of pattern formation in a substrate.

Referring to FIG. 6, a substrate 12 may be manufactured with a CoC top layer 102 over the substrate 12. For example, hard disk drive media may often be manufactured with a CoC top layer 102 over the substrate 12. However, commonly used adhesion materials may have inconsistent adhesion to CoC 102. As such, an intermediate layer 100 may be applied between CoC layer 102 and adhesion layer 60 as an adhesion promoter or enhancer (as illustrated in FIG. 6).

Intermediate layer 100 may be formed from a material having a greater adhesion to the substrate 12 than the adherence material 60, and having a greater adhesion to the adherence material 60 than the substrate 12. Thus, the intermediate layer 100 has good adhesion to both the adhesion layer 60 and the CoC top layer 102 of the substrate 12. For example, intermediate layer 100 may be formed of one or a combination of materials, including, but not limited to, Tantalum (Ta), Silicon (Si), Silicon Nitride ($Si_xN_y$), Silicon Oxide ($SiO_x$), Chromium (Cr), Chromium Nitride ($CrN_x$), Titanium-Tungsten (TiW), Titanium-Chromium (TiCr), Ruthenium (Ru), and the like. In one embodiment, intermediate layer 100 may have a thickness $t_3$ of approximately 3-15 nm.

FIG. 7 illustrates an exemplary pattern transfer of a pattern from patterned layer 46 onto substrate 12. In this example, substrate 12 includes an adhesion layer 60, an intermediate layer 100, and a CoC layer 102 in addition to the patterned layer 46. Often, the substrate 12 may be manufactured having a CoC layer 102. In one embodiment, the intermediate layer 100 may be positioned on the CoC layer 102 as part of the in situ cleaning and conditioning process described above. Additionally, in an embodiment, the adhesion layer 60 may be positioned on intermediate layer 100 as part of the in situ cleaning and conditioning process.

As illustrated in FIG. 7, during Phase 0, the patterned layer 46 may be formed on the adhesion layer 60 using the imprint process described above, defining a recession 70 and protrusions 72. During pattern transfer Phase 1, portions of the patterned layer 46 and the adhesion layer 60 in superimposition with the recession 70 may etched (removed). For example, the patterned layer 46 and the adhesion layer 60 may be removed using a descum process, such as an oxygen based plasma etch, or the like.

During pattern transfer Phase 2, portions of the intermediate layer 100 and the CoC layer 102 in superimposition with recessions 70 may be removed via an etching process. In one embodiment, the intermediate layer 100 and the CoC layer 102 are removed in a post mask etch process. For example, if silicon nitride ($Si_3N_4$) is used as an intermediate layer 100, then an F-based plasma etch (fluorine based) may be used to etch the intermediate layer 100 and an oxygen based plasma etch may be used to etch the CoC layer 102.

During pattern transfer Phase 3, the pattern from patterned layer 46 may be transferred into the substrate 12 using, for example, a physical or chemical etch process. The intermediate layer 100, adhesion layer 106, or patterned layer 46 can be used as a mask for the pattern transfer process.

In an alternative embodiment of pattern transfer Phase 3, the patterned layer 46 and the adhesion layer 60 may be removed first, using, for example, a plasma etch process, followed by the pattern transfer into the substrate 12.

During pattern transfer Phase 4, the intermediate layer 100, adhesion layer 60, and patterned layer 46 may be removed if they are still included with the substrate 12, (e.g., post pattern transfer) resulting in a patterned substrate 12.

What is claimed is:

1. A method of applying an adhesion layer to a substrate, comprising:
   depositing an intermediate layer onto the substrate;
   placing the substrate into a process chamber;
   evacuating the process chamber of gases;
   injecting a cleaning agent into the process chamber;
   evacuating the process chamber of the cleaning agent;
   injecting an adherence material into the process chamber, the adherence material being deposited onto the intermediate layer;
   delivering water vapor into the process chamber; and
   evacuating the process chamber of the water,
   wherein the intermediate layer has a greater direct adhesion to the substrate as compared to direct adhesion of the adherence material to such a substrate, and wherein the adherence material has a greater direct adhesion to the intermediate layer as compared to direct adhesion of the adherence material to such a substrate.

2. The method of claim 1, wherein the intermediate layer comprises at least one of: Tantalum (Ta), Silicon (Si), Silicon Nitride ($Si_xN_y$), Silicon Oxide ($SiO_x$), Chromium (Cr), Chromium Nitride ($CrN_x$), Titanium-Tungsten (TiW), Titanium-Chromium (TiCr), and/or Ruthenium (Ru).

3. The method of claim 1, wherein the substrate comprises a carbon over coating (CoC) top layer.

4. The method of claim 1, wherein the cleaning agent is comprised of at least one of ozone, ultraviolet light (UV), or plasma.

5. The method of claim 1, wherein the substrate comprises an imprint lithography substrate.

* * * * *